United States Patent [19]
Nakaho

[11] Patent Number: 5,686,911
[45] Date of Patent: Nov. 11, 1997

[54] CONTACT TYPE ROTARY ENCODER EMPLOYING ELECTRICALLY CONDUCTIVE BALLS AS SWITCHING CONTACTS FOR PRINTED CIRCUIT ELECTRODES

[75] Inventor: Junichi Nakaho, Aichi, Japan

[73] Assignee: Kabushiki Kaisha Tokai Rika Denki Seisakusho, Aichi, Japan

[21] Appl. No.: 490,858

[22] Filed: Jun. 15, 1995

[30] Foreign Application Priority Data

Jun. 20, 1994 [JP] Japan .................................. 6-173060

[51] Int. Cl.$^6$ .................................................. H03M 1/22
[52] U.S. Cl. .................................................. 341/16
[58] Field of Search .......................... 341/16, 17

[56] References Cited

U.S. PATENT DOCUMENTS 3,781,866 12/1973 Kilby ........................................ 341/16

Primary Examiner—Howard L. Williams
Attorney, Agent, or Firm—Finnegan, Henderson, Farabow, Garrett & Dunner, L.L.P.

[57] ABSTRACT

A contact type rotary encoder, comprising a printed wiring board having annular comb-shaped electrodes, and an arcuate electrode printed thereon, and a rotary member having three through-holes positioned around the center thereof at substantially equal angular intervals, and at different distances from the center of the rotary member. The contact type rotary encoder further comprises electrically conductive balls rotatably fitted in the through-holes and positioned to roll on the electrodes.

4 Claims, 6 Drawing Sheets

ANGLE OF POTATION

CONTACT TYPE ROTARY ENCODER EMPLOYING ELECTRICALLY CONDUCTIVE BALLS AS SWITCHING CONTACTS FOR PRINTED CIRCUIT ELECTRODES

BACKGROUND OF THE INVENTION

1. Field Invention

This invention relates to a "rotary encoder" which outputs a pulse signal according to an angle of rotation. The rotary encoder is employed, for example, in an automobile, to detect the angle of rotation of the steering wheel.

2. Related Art

A conventional rotary encoder will be described with reference to FIGS. 9 and 10. In FIG. 10, reference numeral 1 designates a disk-shaped printed wiring board having a central hole. Annular comb-shaped electrodes 2 and 3 each having teeth at equal intervals, and an arcuate electrode 4 are formed on the disk-shaped printed wiring board 1 in such a manner that electrodes 2, 3 and 4 are coaxially arranged around the center of the board 1. For instance, an electrically conductive brush member 31, as shown in FIG. 9, is slid on the electrode 2, and is detected when the brush member 31 is electrically connected to or disconnected from the electrode 2 (or 3 or 4). This detection is utilized to form a contact type rotary encoder relatively low in manufacturing cost. However, since the brush member 31 is slid on the electrode 2, the brush member 31 and/or the electrode 2 is worn, forming abrasion powder which produces noises. In addition, when the rotary encoder is operated for a long time, and the electrode 2 and/or the brush member 31 are worn out; the rotary encoder may become out of order.

Thus, in a conventional rotary encoder, since the brush members are slid on the electrodes formed on the printed wiring board, the brush members and/or the electrodes are mechanically worn and deteriorated, which reduces the encoder durability.

SUMMARY OF THE INVENTION

Accordingly, an object of the invention is to provide a contact type rotary encoder which is free from the above-described problems accompanying a conventional contact type rotary encoder, and which has a high durability.

In order to solve the problem of the conventional contact type rotary encoder, the present invention comprises a contact type rotary encoder in which, instead of the brush members sliding on the printed electrodes, electrically conductive balls are employed which are rolled on the printed electrodes.

In the rotary encoder of the present invention after, the balls are rolled on the printed electrodes, the mechanical wear of the balls and the printed electrodes is minimized. That is, although the rotary encoder is of contact type, it still has a high durability.

DETAILED DESCRIPTION OF THE PREFERRED EMBODIMENTS

Figure 1:
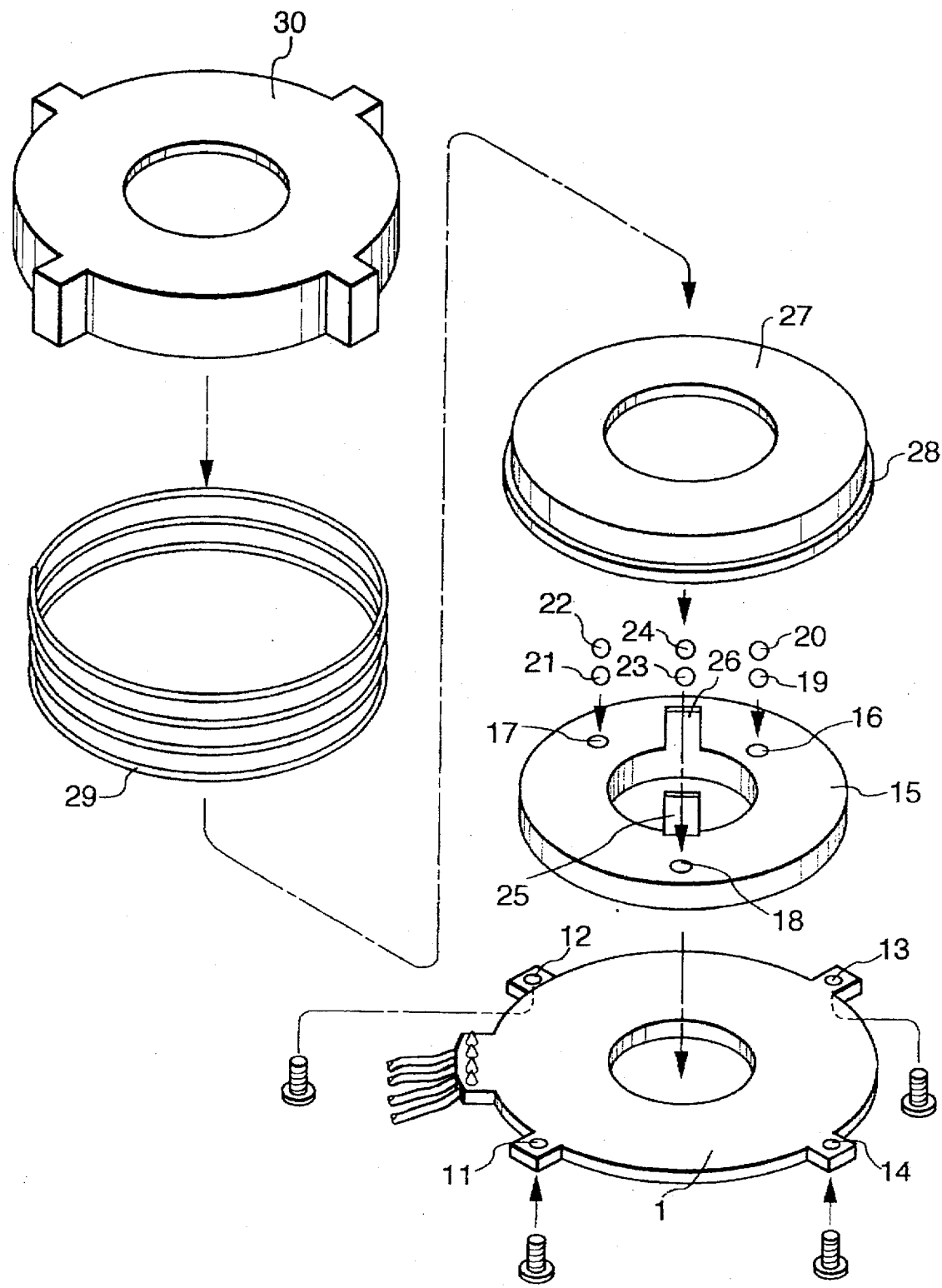
FIG. 1 is an exploded perspective view of a contact type rotary encoder according to the present invention.
Figure 2:
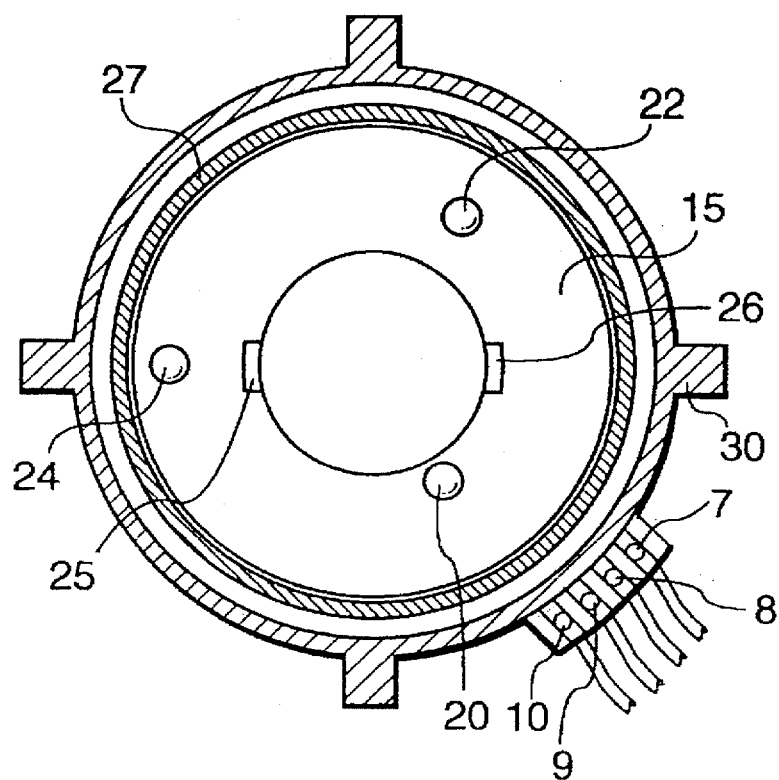
FIG. 2 is a front view showing the interior of the rotary encoder according to the present invention.
Figure 3:
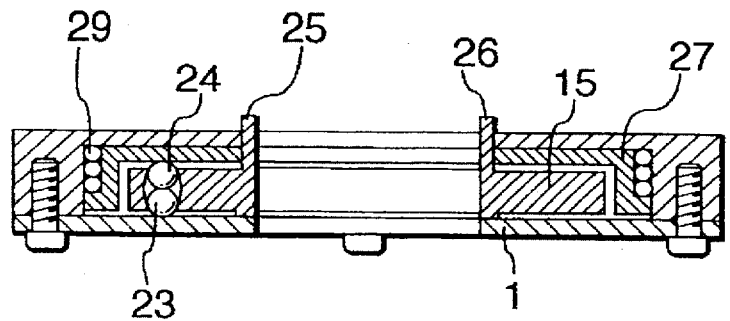
FIG. 3 is a sectional view of the rotary encoder of the present invention.
Figure 4:
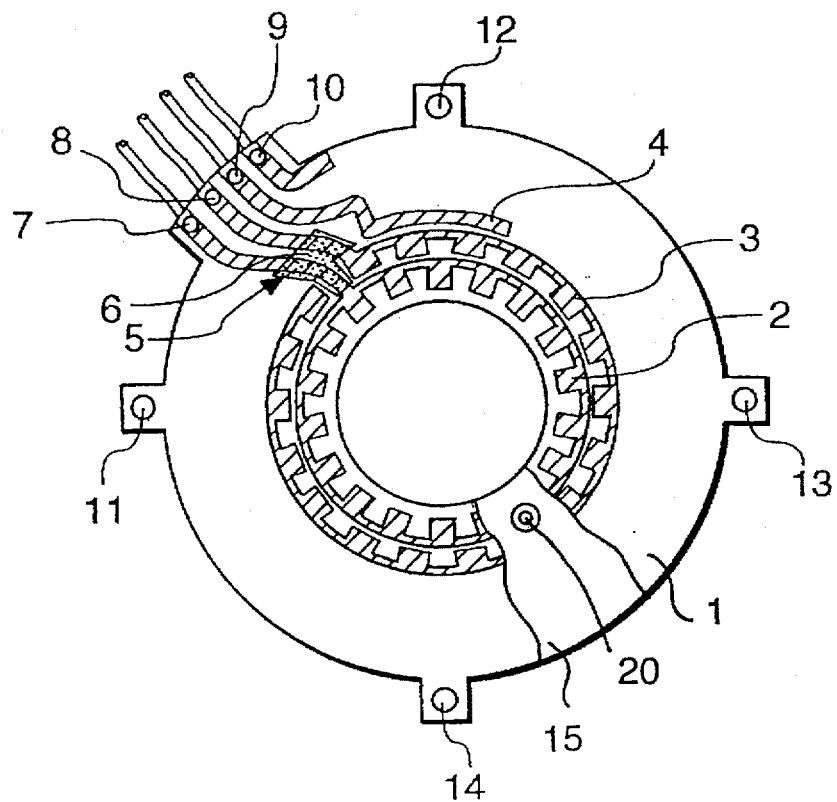
FIG. 4 is a sectional view showing an electrode pattern formed on a printed wiring board in the rotary encoder of the present invention.

A contact type rotary encoder of the present invention, will be described with reference to FIGS. 1 through 4. FIG. 1 is an exploded perspective view of the contact type rotary encoder according to the present invention. FIGS. 2 and 3 are a front view and a sectional view of the rotary encoder of the present invention, respectively. FIG. 4 is a sectional view showing an electrode pattern formed on a printed wiring board in the rotary encoder of the present invention.

In those figures, reference numeral 1 designates a disk-shaped printed wiring board having a central hole. Annular comb-shaped electrodes 2 and 3 each having teeth at equal intervals, and an arcuate electrode 4 are formed on the printed wiring board 1 in such a manner that electrodes 2, 3 and 4 area coaxially arranged around the center of the printed wiring board 1. The annular electrode 3 has a cut 5 through which a conductor is extended to connect the annular electrode 2 to an external connecting terminal 7. The annular electrode 3 is connected through a conductor to an external connecting terminal 8, and the arcuate electrode 4 is connected to an external connecting terminal 9. Another external connecting terminal 10 is connected to an upper electrode 27 (not shown in FIG. 4). The conductor connected between the electrode 2 and the external connecting terminal 7, and the conductor connected between the electrode 3 and the external connecting terminal 8 are covered with an insulating film 6. The printed wiring board 1 has screw holes 11, 12, 13 and 14 in the peripheral portion at equal angular intervals which are used for fixing a cover 30 (described later).

In FIGS. 1 and 2, reference numeral 15 designates a disk-shaped rotary member having a central hole. The rotary member 15 has three through-holes 16, 17 and 18 which are positioned around the center of the rotary member 15 at substantially equal angular intervals, different in distance from the center of the rotary member 15. Electrically conductive balls 19 and 20, 21 and 22, and 23 and 24 are rotatably fitted in the through-holes 16, 17, and 18, respectively. The thickness of the rotary member 15 is slightly smaller than the sum of the diameters of the two electrically conductive balls, so that the latter slightly protrude from the rotary member 15. The radial positions of the through-holes correspond to the radii of the electrodes 2, 3 and 4 on the printed wiring board 1, respectively. That is, as the rotary member 15 rotates, the conductive balls in the through-holes are rolled on the comb-shaped electrodes 2 and 3 and the arcuate electrode 4, respectively. The rotary member 15 also has pawls 25 and 26 which engage with an external rotating body.

Further in FIGS. 1 and 2, reference numeral 27 designates a circular upper electrode having a central hole. The upper electrode 27 is made of an electrically conductive material, and has an annular flange 28 around it which receives a coil spring 29. The coil spring 29 is interposed between the cover 30 and the flange 28 of the upper electrode 27.

The above-described components are assembled as shown in FIG. 3. That is, the printed circuit board 1 is secured to the cover 30 with screws, so that the rotary member 15 is rotatably held between them, and the upper electrode 27 pushes the electrically conductive balls 19 through 24 against the printed wiring board 1 with the aid of the coil spring 29. In the rotary encoder thus formed, the electrically conductive balls are located at three positions which are substantially uniformly distributed, and thus are substantially equally loaded.

The operation of the contact type rotary encoder thus formed will be described with reference to FIGS. 5 through 8.

Figure 5:
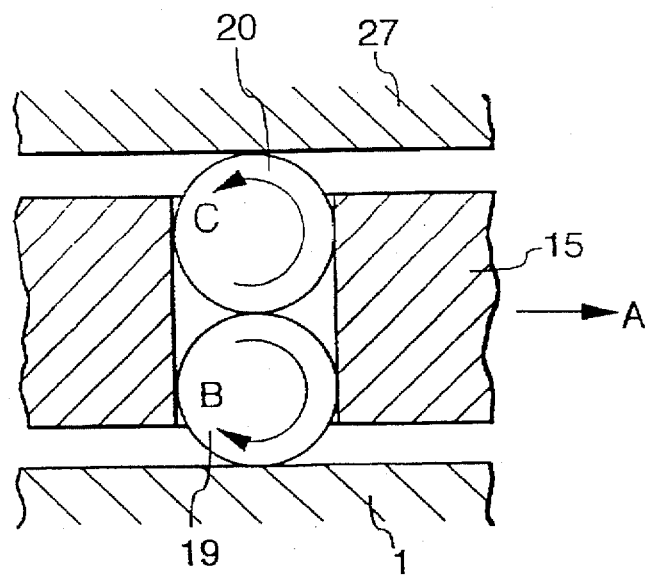
FIG. 5 is a sectional view showing the operation of the electrically conductive balls in the rotary encoder of the present invention.
Figure 6:
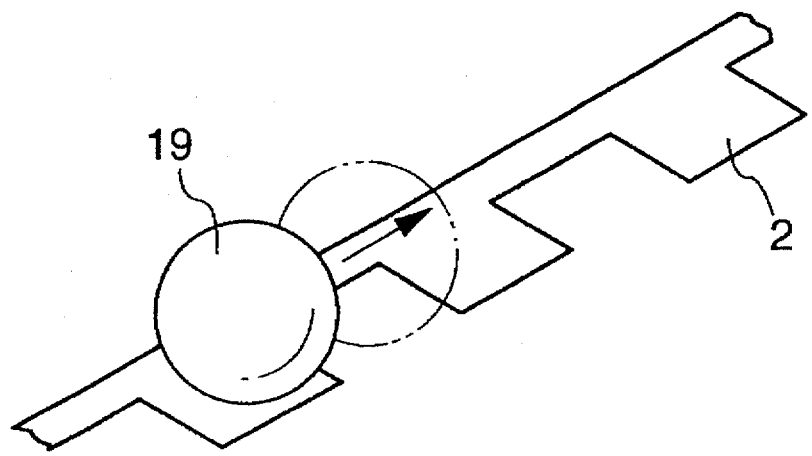
FIG. 6 is a perspective view showing the operation of an electrically conductive ball on an electrode in the rotary encoder of the present invention.

As the rotary member 15 is rotated in association with the rotation of an external rotating body, the balls 19 and 20 together with the rotary member 15 are moved in the direction of the arrow A, as shown in FIG. 5. Since the balls 19 and 20 are held between the printed wiring board 1 and the upper electrode 27 under a suitable pressure, ball 19 is rolled on the printed wiring board 1 in the direction of the arrow B, without sliding while ball 20 is rolled on the upper electrode 27 in the direction of the arrow C, without sliding. The remaining balls 21 and 22, and 23 and 24 also operate in the same manner as the above-described balls 19 and 20.

Ball 19 (or 21) is moved on the comb-shaped electrode 2 (or 3), and therefore the ball 19 (or 21) is alternatively electrically connected to and disconnected from the electrode 2 (or 3). Ball 23 is electrically connected to the arcuate electrode 4 for a period of time which corresponds to the angle of arc of the electrode 4 while the rotary member 15 makes one revolution. Lower balls 19, 21 and 23 are in contact with the upper balls 20, 22 and 24, respectively. The upper balls 20, 22 and 24 are in contact with the upper electrode 27, and the upper electrode 27 is connected to the external connecting terminal 10 as with above described before. Hence, as the rotary member 15 is turned, the external connecting terminal 7 connected to the electrode 2 and the external connecting terminal 10 are alternately electrically connected to and disconnected from each other. Further the external connecting terminal 7 connected to the electrode 3 and the external connecting terminal 10 are alternately electrically connected to and disconnected from each other. Finally, the arcuate electrode 4 connected to the external connecting terminal 9 and the external connecting terminal 10 are alternately electrically connected to and disconnected from each other.

Figure 7:
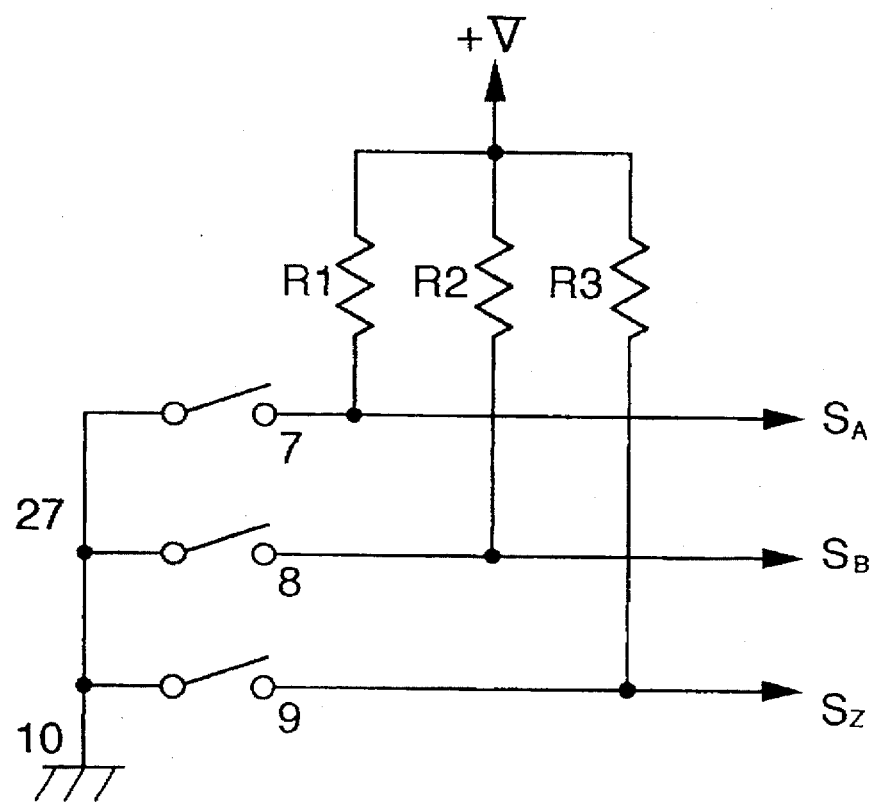
FIG. 7 is a circuit diagram of the rotary encoder according to the present invention.
Figure 8:
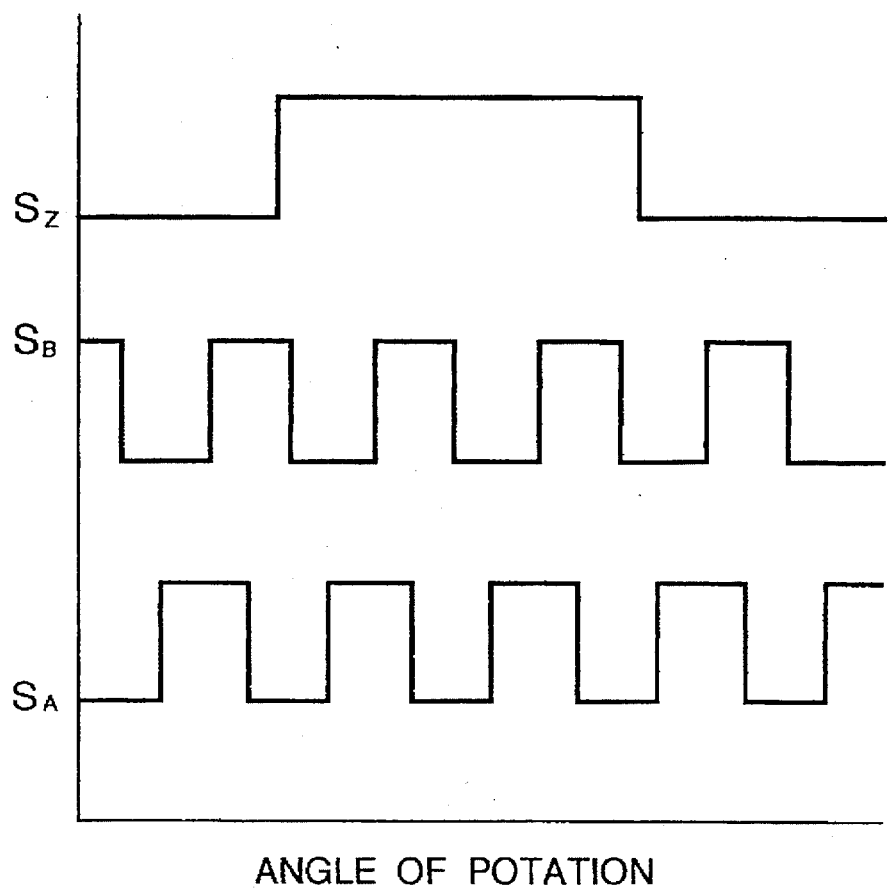
FIG. 8 is a waveform diagram showing the output signals of the rotary encoder according to the present invention.
Figure 9:
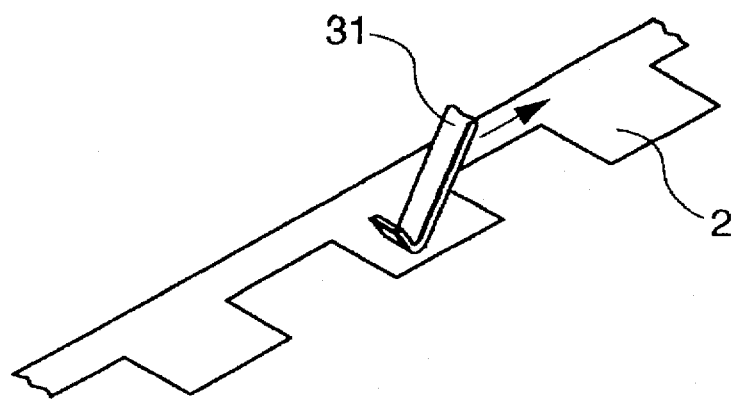
FIG. 9 is a perspective view showing the operation of a conventional contact type rotary encoder.
Figure 10:
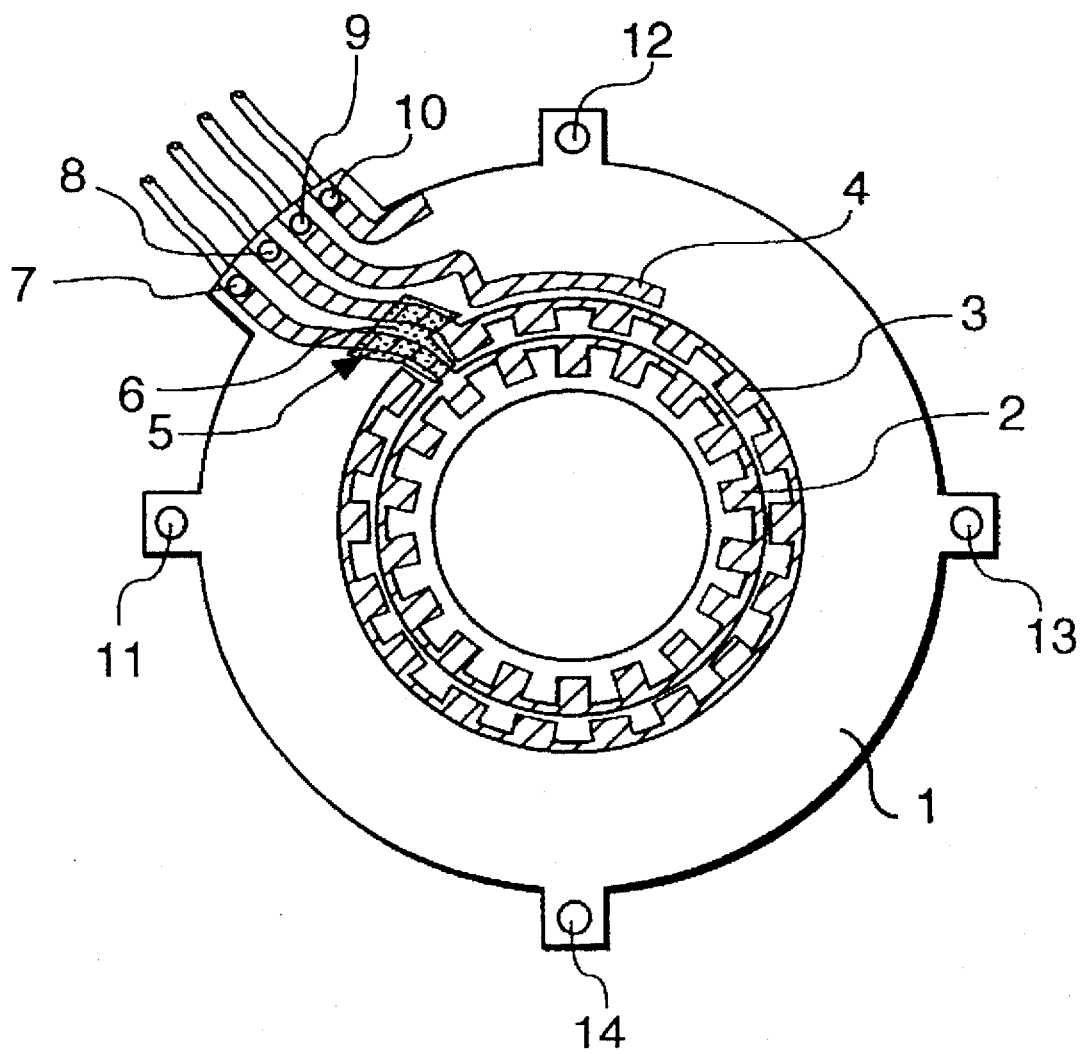
FIG. 10 is a sectional view showing an electrode pattern formed on a printed wiring board in a conventional rotary encoder.

FIG. 7 shows a circuit for obtaining signals representing the electrical connection and disconnection of the terminals. In the circuit, the external connecting terminal 10 is grounded, and the external connecting terminals 7, 8 and 9 are connected through resistors R1, R2 and R3 to a power source having a voltage +V. When the external connecting terminals 7, 8 and 9 are electrically connected to the external connecting terminal 10, they have ground potential, whereas when they are electrically disconnected from the terminal 10, they have the voltage +V of the power source. In other words, as the rotary member 15 turns, the external connecting terminals 7, 8 and 9 are alternately connected to and disconnected from the external connecting terminal 10, and produce output signals $S_A$, $S_B$ and $S_Z$, respectively, as shown in FIG. 8. The positional relations between the comb-shaped electrodes 2 and 3 and the through-holes 16 and 17 of the rotary member are so determined that the phase of the signal $S_A$ shifted as much as a quarter period from that of the signal $S_B$. Similarly, the positional relation between the arcuate electrode 4 and the through-hole 18 of the rotary member 15 is determined. Signals $S_A$, $S_B$ and $S_Z$ are the same as those provided in an ordinary rotary encoder. That is, the relative angle of rotation and the direction of rotation of the rotating body can be detected from the signals $S_A$ and $S_B$, and the absolute rotational angular position can be detected from the signal $S_Z$.

As is apparent from the above description, the contact type rotary encoder of the present invention comprises a simple structure, and does not require an intricate signal processing circuit. In addition, the rotary encoder of the present invention has a low manufacturing cost, yet provides outputs which are high in accuracy. Furthermore, in the rotary encoder of the present invention, unlike the conventional one, the contact between the electrodes creates no sliding motion. Hence, the rotary encoder of the present invention has much less abrasion, and high in durability.

What is claimed is:

1. A contact type rotary encoder comprising:

a circular rotary member having through-holes positioned around a center of said rotary member at substantially equal angular intervals and at different distances from the center of said rotary member;

a pair of electrically conductive balls rotatably fitted in a respective one of said through-holes of said rotary member, such that each of said pair of balls make rolling contact with each other and protrude slightly from opposing ends of said respective through-hole;

a substrate having one of annular and arcuate printed circuit electrodes having radii corresponding to the positions of said through-holes;

an electrode board whose entire surface is electrically conductive; and an elastic member acting said electrode board to maintain said pair of balls in said through-holes and between said electrode board and said substrate.

2. A contact type rotary encoder as claimed in claim 1, wherein said printed electrodes of said substrate face the electrically conductive surface of said electrode board, and said electrically conductive balls are pushed by said electrode board against said substrate by said elastic member, said electrically conductive balls rolling on said printed electrodes and said electrode board surface as said rotary member turns, whereby said printed electrodes are electrically connected to and disconnected from said electrode board through said electrically conductive balls to provide rotation angle signals.

3. A contact type rotary encoder as claimed in claim 2, wherein said rotation angle signals are shifted a quarter period from each other.

4. A contact type rotary encoder as claimed in claim 1, wherein said through-holes are formed at three points on said rotary member.

* * * * *